(12) United States Patent

Wang

(10) Patent No.: US 8,238,585 B2
(45) Date of Patent: Aug. 7, 2012

(54) AUDIO PLAYING MODULE AND METHOD OF THE SAME

(75) Inventor: Ko-Kang Wang, Taipei County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 679 days.

(21) Appl. No.: 12/333,975

(22) Filed: Dec. 12, 2008

(65) Prior Publication Data

US 2009/0154732 A1 Jun. 18, 2009

(30) Foreign Application Priority Data

Dec. 18, 2007 (TW) ................................ 96148421 A

(51) Int. Cl.
*H04R 25/00* (2006.01)
(52) U.S. Cl. .......................................... 381/152; 381/412
(58) Field of Classification Search .................. 381/152, 381/412
See application file for complete search history.

(56) References Cited

U.S. PATENT DOCUMENTS

| | | | | |
|---|---|---|---|---|
| 3,008,013 A | * | 11/1961 | Peter et al. ..................... | 381/182 |
| 4,352,961 A | * | 10/1982 | Kumada et al. ............... | 455/350 |
| 5,638,456 A | * | 6/1997 | Conley et al. ................. | 381/190 |
| 5,796,854 A | * | 8/1998 | Markow ........................ | 381/385 |
| 6,324,052 B1 | * | 11/2001 | Azima et al. .............. | 361/679.23 |
| 6,934,402 B2 | * | 8/2005 | Croft et al. .................... | 381/412 |
| 7,302,077 B2 | * | 11/2007 | Bachmann et al. ........... | 381/412 |
| 2001/0026625 A1 | * | 10/2001 | Azima et al. .................. | 381/152 |
| 2002/0118847 A1 | * | 8/2002 | Kam ............................. | 381/111 |
| 2003/0059080 A1 | * | 3/2003 | Backman ...................... | 381/407 |
| 2003/0222766 A1 | * | 12/2003 | Rollins et al. .............. | 340/407.1 |
| 2005/0264472 A1 | * | 12/2005 | Rast ................................ | 345/30 |
| 2007/0036388 A1 | * | 2/2007 | Lee et al. ...................... | 381/431 |
| 2007/0282208 A1 | * | 12/2007 | Jacobs et al. .................. | 600/485 |

FOREIGN PATENT DOCUMENTS

WO    WO 2007060781 A1 *  5/2007

\* cited by examiner

*Primary Examiner* — Steven J Fulk

(74) *Attorney, Agent, or Firm* — Muncy, Geissler, Olds & Lowe, PLLC

(57) ABSTRACT

An audio module used for a display device is disclosed. The display device has a display substrate. The audio module has a filter, an amplifier, and at least one output unit. The filter receives and filters an audio signal to generate a filtered signal. The amplifier is coupled to the filter and amplifies the filtered signal to generate an amplified signal. At least one output unit is coupled to the amplifier and plays the amplified signal in a predetermined way.

13 Claims, 8 Drawing Sheets

AUDIO PLAYING MODULE AND METHOD OF THE SAME

CROSS REFERENCE TO RELATED APPLICATIONS

This application claims priority of Taiwanese Patent Application Serial No. 096148421, filed on Dec. 18, 2007, the entirety of which is incorporated by reference herein.

BACKGROUND OF THE INVENTION

1. Field of the Invention

The invention relates to an audio module and, in particular, to an audio module built in a thin film display.

2. Description of the Related Art

Driven by development in the optoelectronics industry, displays have progressed from cathode ray tube displays to flat panel displays, such as LCD displays or plasma displays. Meanwhile, a more compact electronic ink display has also been developed. Electronic ink is fluid with a plurality of charged liquid molecules. The movement of charged liquid molecules depends on the electric field applied to the fluid, and the distribution in the fluid determines the show of the electronic ink display. Accordingly, the electronic ink display can utilize reflective display means and no back light system is required. As a result, the electronic ink display is small, lightweight and power-green.

Due to the compact nature of the electronic ink display, no space within the display is available to accommodate audio modules, such that the electronic ink display only displays images and does not play sound, resulting in limited applications. Thus, enabling the electronic ink display to output sound, is an important issue for modern electronic ink display development.

BRIEF SUMMARY OF THE INVENTION

An embodiment of an audio module used for a display device is provided. The display device has a display substrate. The audio module comprises a filter, an amplifier, and at least one output unit. The filter receives and filters an audio signal to generate a filtered signal. The amplifier is coupled to the filter and amplifies the filtered signal to generate an amplified signal. At least one output unit is coupled to the amplifier and outputs the amplified signal in a predetermined way.

An embodiment of an audio output method used for a display device comprising a display substrate is provided. The audio output method comprises receiving and filtering an audio signal to generate a filtered signal, amplifying the filtered signal to generate an amplified signal, and playing the amplified signal in a predetermined way A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is the best-contemplated mode of carrying out the invention. This description is made for the purpose of illustrating the general principles of the invention and should not be taken in a limiting sense. The scope of the invention is best determined by reference to the appended claims.

Figure 1:
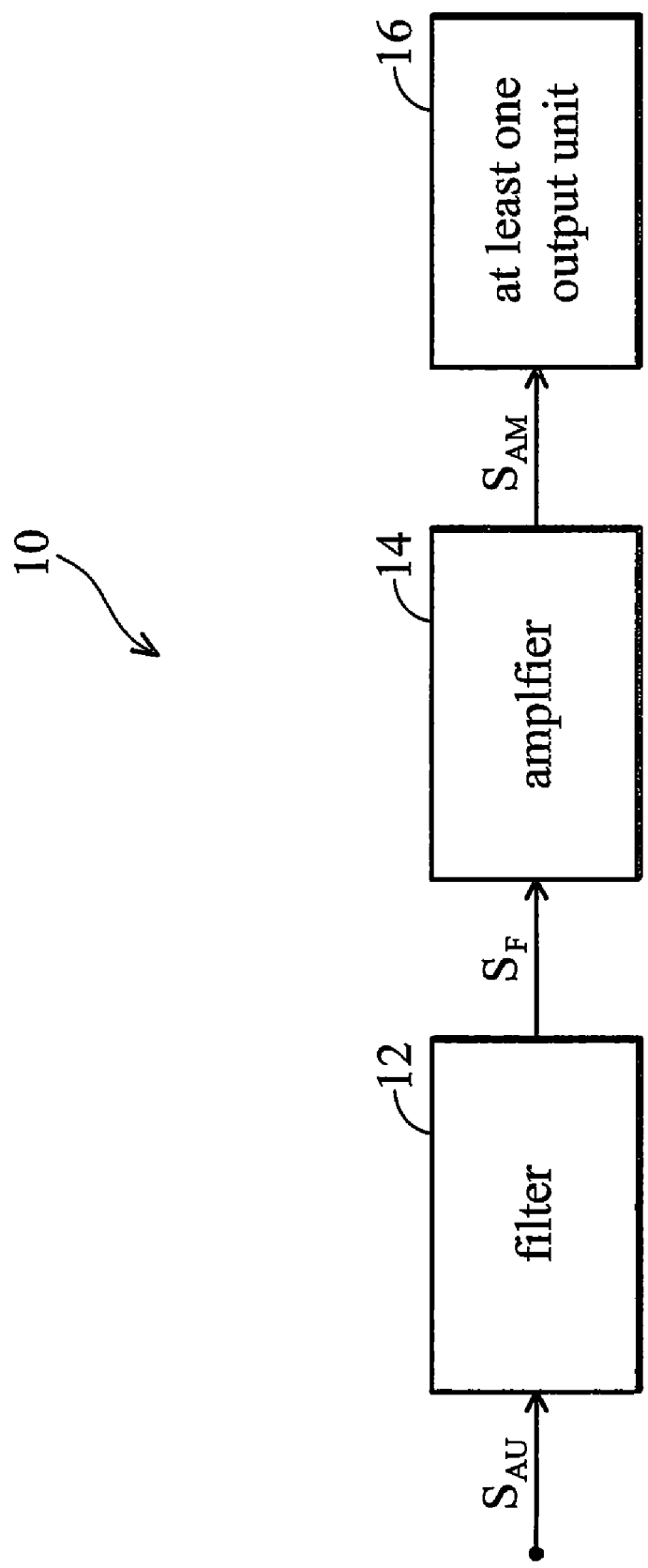
FIG. 1 is a schematic diagram of an audio module according to the embodiment of the invention.

FIG. 1 is a schematic diagram of an audio module according to an embodiment of the invention. As shown FIG. 1, the embodiments disclose an audio module 10 for a display device (not shown in FIG. 1) is used to perform the audio signal. The display device (not shown in FIG. 1) comprises a display substrate (not shown in FIG. 1) to show the image from the display device. In the embodiment, the display device (not shown in FIG. 1) is a thin film display (not shown in FIG. 1). Alternatively, the display device (not shown in FIG. 1) may be an electronic ink display (not shown in FIG. 1). The audio module 10 comprises a filter 12, an amplifier 14, and at least one output unit 16. The filter 12 receives and filters an audio signal $S_{AU}$ to generate a filtered signal $S_F$. In the preferred embodiment, the filter 12 performs equalization filtering to the audio signal $S_{AU}$ to generate the filtered signal $S_F$ such that optimum acoustic frequency for output unit 16 in the back end can be obtained. The amplifier 14 is coupled to the filter 12 and amplifies the filtered signal $S_F$ to generate an amplified signal $S_{AM}$. At least one output unit 16 is coupled to the amplifier 14 and outputs the amplified signal $S_{AM}$ in a predetermined way.

Figure 2A:
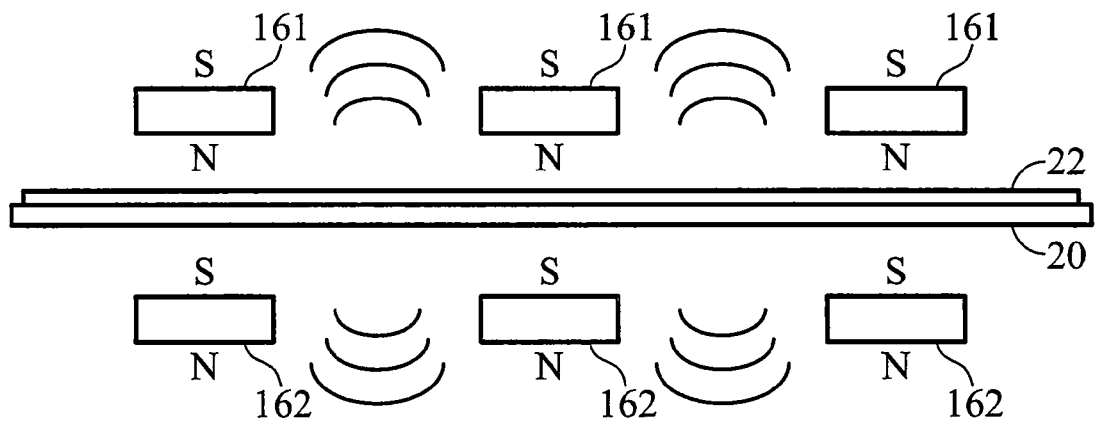
FIG. 2A is a lateral view of at least one output unit of the audio module according to the embodiment of the invention.

FIG. 2A is a lateral view of at least one output unit of the audio module according to an embodiment of the invention. As shown in FIG. 2A, in the embodiment, the predetermined way to output audio signal is a magnetic way. At least one output unit 16 outputs the amplified signal in the magnetic way. In the embodiment, the audio module 10 comprises a plurality of coils 22 disposed on the display substrate 20. These coils 22 are disposed around the periphery of the display substrate 20 and do not affect displaying of the display substrate 20. At least one output unit 16 includes a plurality of magnetic device kits. The above magnetic device kits respectively have a first magnetic device kit 161 and a second magnetic device kit 162. The first and second magnetic device kits 161 and 162 are respectively disposed on both sides of the display substrate 20. The first magnetic polarity N of each magnetic device in the first magnetic device kit 161 is opposite to the second magnetic polarity S of each magnetic device in the second magnetic device kit 162. In preferred embodiment, each of the magnetic devices in the magnetic device kits 161 and 162 is a magnet. In preferred embodiment, controlling the placement of magnetic polarities of the magnets can generate a magnetic force thereby outputting the amplified signal $S_{AM}$.

Figure 2B:
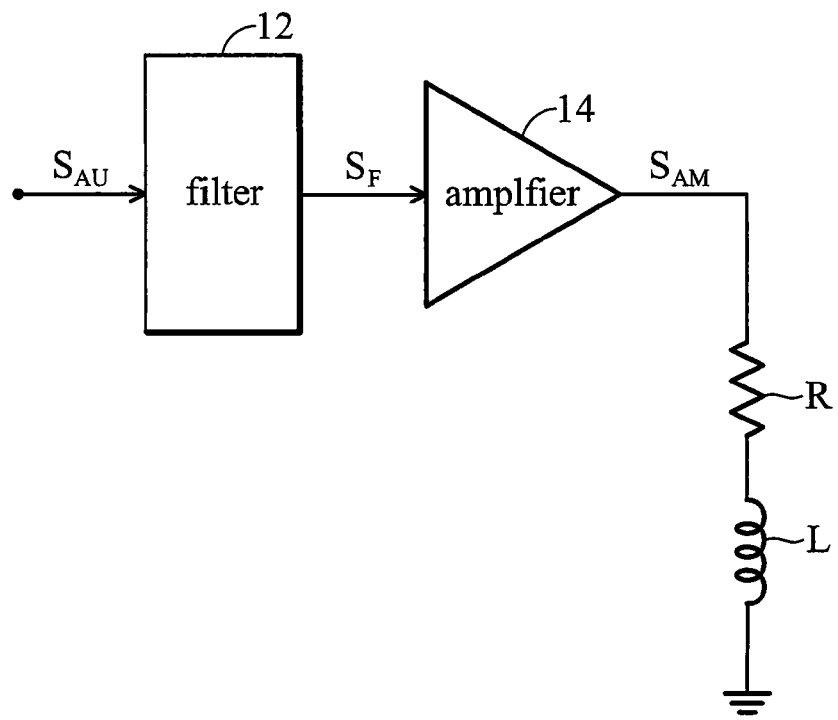
FIG. 2B is an equivalent circuit diagram of the audio module according to the embodiment of the invention.

FIG. 2B is an equivalent circuit diagram of an audio module according to the embodiment shown in FIG. 2A. The equivalent circuit diagram of using a magnetic force to output the amplified signal $S_{AM}$ is shown in FIG. 2B, wherein, the magnet is equivalent to a resistor R in series with an inductor L to generate a magnetic force such that the amplified signal $S_{AM}$ can be outputted.

Figure 3A:
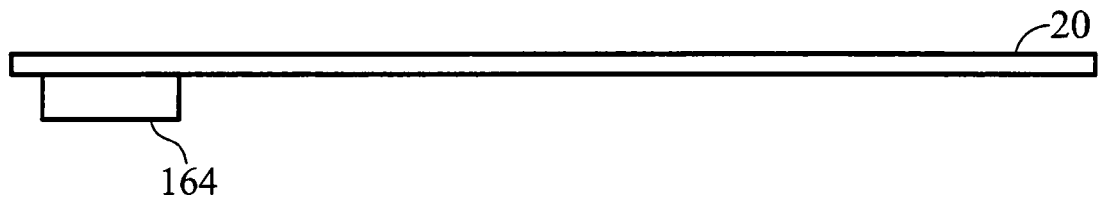
FIG. 3A is a lateral view of at least one output unit of an audio module according to another embodiment of the invention.

FIG. 3A is a schematic diagram of at least one output unit of an audio module according to another embodiment of the invention. As shown in FIG. 3A, in the embodiment, the predetermined way is a wave way. At least one output unit 16 outputs the amplified signal $S_{AM}$ in a piezoelectric way. At least one output unit 16 is a piezoelectric device 164. The piezoelectric device 164 is disposed on the display substrate 20 and used to generate a wave. In preferred embodiment, the piezoelectric device is an acoustic speaker.

Figure 3B:
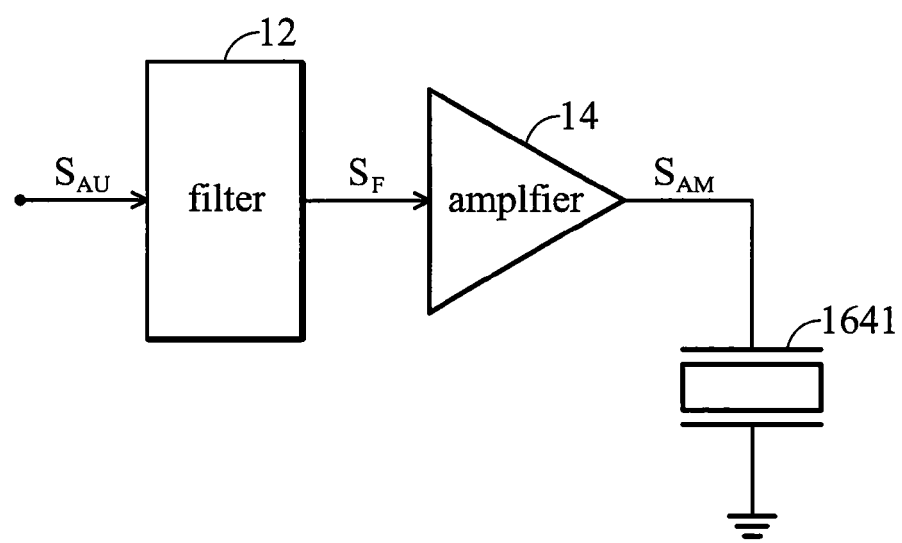
FIG. 3B is an equivalent circuit diagram of the audio module according to the another embodiment of the invention.

FIG. 3B is an equivalent circuit diagram of an audio module according to another embodiment shown in FIG. 3A. The equivalent circuit diagram of using a piezoelectric force to output the amplified signal $S_{AM}$ is shown in FIG. 3B, wherein the piezoelectric device is equivalent to an oscillator 1641 to generate a wave such that the amplified signal $S_{AM}$ can be outputted.

Figure 4A:
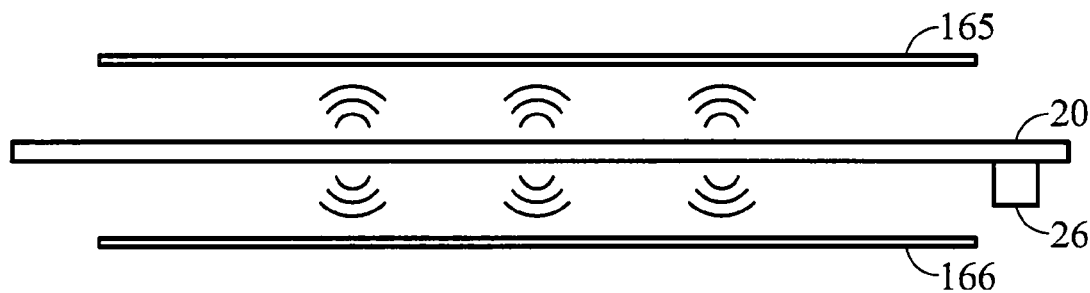
FIG. 4A is a lateral view of at least one output unit of an audio module according to yet another embodiment of the invention.

FIG. 4A is a schematic diagram of at least one output unit of an audio module according to yet another embodiment of the invention. As shown in FIG. 4A, in the embodiment, the predetermined way is a static-electric way. At least one output unit 16 outputs the amplified signal $S_{AM}$ in the static-electric way. The audio module 10 further comprises a bias source 26 disposed on the display substrate 20. At least one output unit 16 includes a plurality of electrode device kits. These electrode device kits respectively have a first electrode device 165 and a second electrode device 166. The first and second electrode device 165 and 166 are respectively disposed on both sides of the display substrate 20. In preferred embodiment, each of the electrode devices is an electrode plate. In the embodiment, the bias voltage source 26 is disposed on the display substrate 20 such that charges generated by the electrode devices 165 and 166 results in oscillation of the display substrate to radiate acoustic wave. In addition, in the preferred embodiment, each electrode device in the electrode kits 165 and 166 is a transparent electrode grating plate disposed on the display substrate. Since the electrode grating plates is transparent, the showing of the display device is not affected.

Figure 4B:
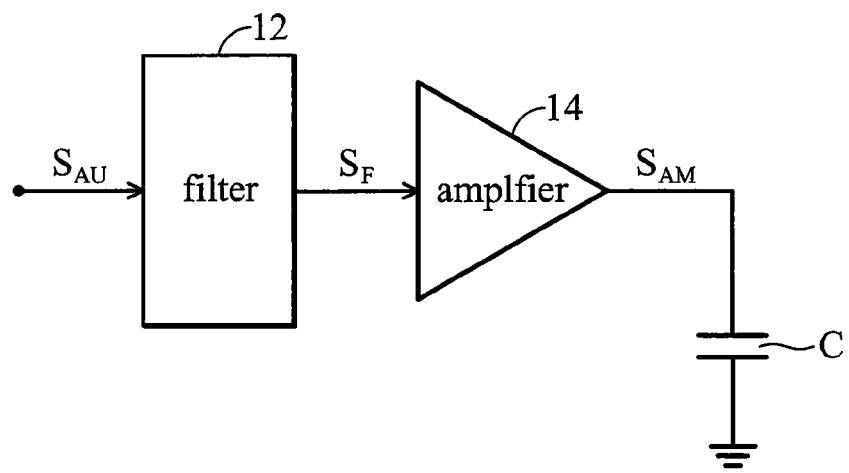
FIG. 4B is an equivalent circuit diagram of the audio module according to yet another embodiment of the invention.

FIG. 4B is an equivalent circuit diagram of an audio module according to yet another embodiment of the invention. The equivalent circuit diagram of using a static-electric force to output the amplified signal $S_{AM}$ is shown in FIG. 4B, wherein the electrode plate is equivalent to a capacitor C to generate a static-electric force such that the amplified signal $S_{AM}$ can be outputted.

Figure 5:
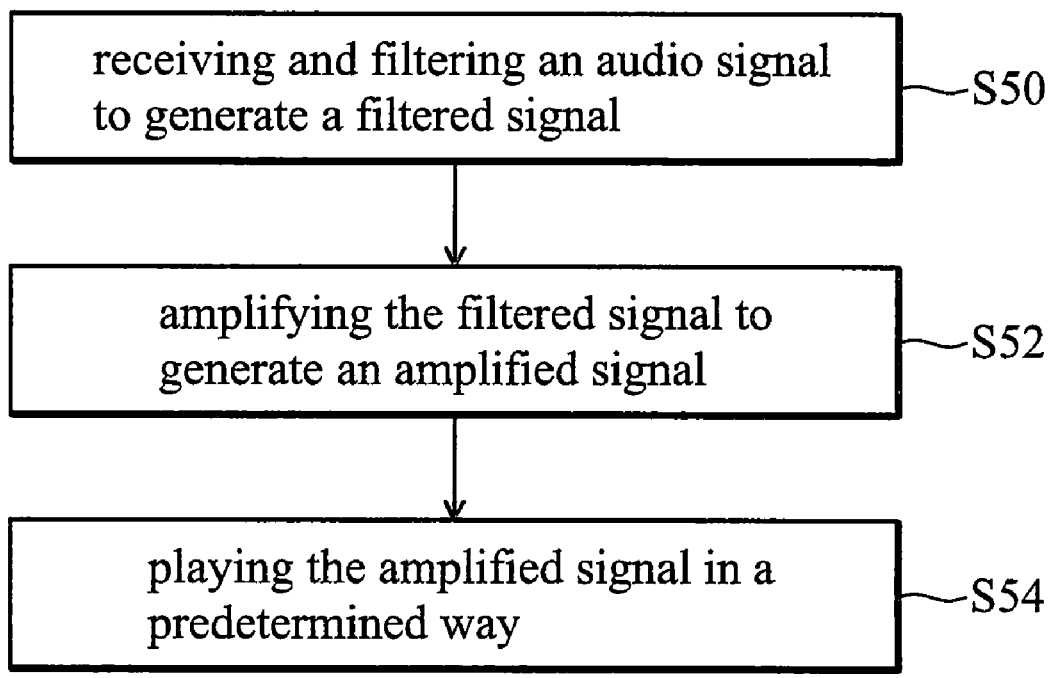
FIG. 5 is a flow chart of an audio output method according to an embodiment of the invention.

FIG. 5 is a flow chart of an audio output method according to an embodiment of the invention. As shown in FIG. 5, the audio output method, applied for a display device with a display substrate, which is used to output audio signal. The audio output method comprises the steps of:

S50: receiving and filtering an audio signal to generate a filtered signal; (in preferred embodiment, the step performs equalization filtering to generate a filtered signal)

S52: amplifying the filtered signal to generate an amplified signal; and

S54: outputting the amplified signal in a predetermined way.

Figure 6A:
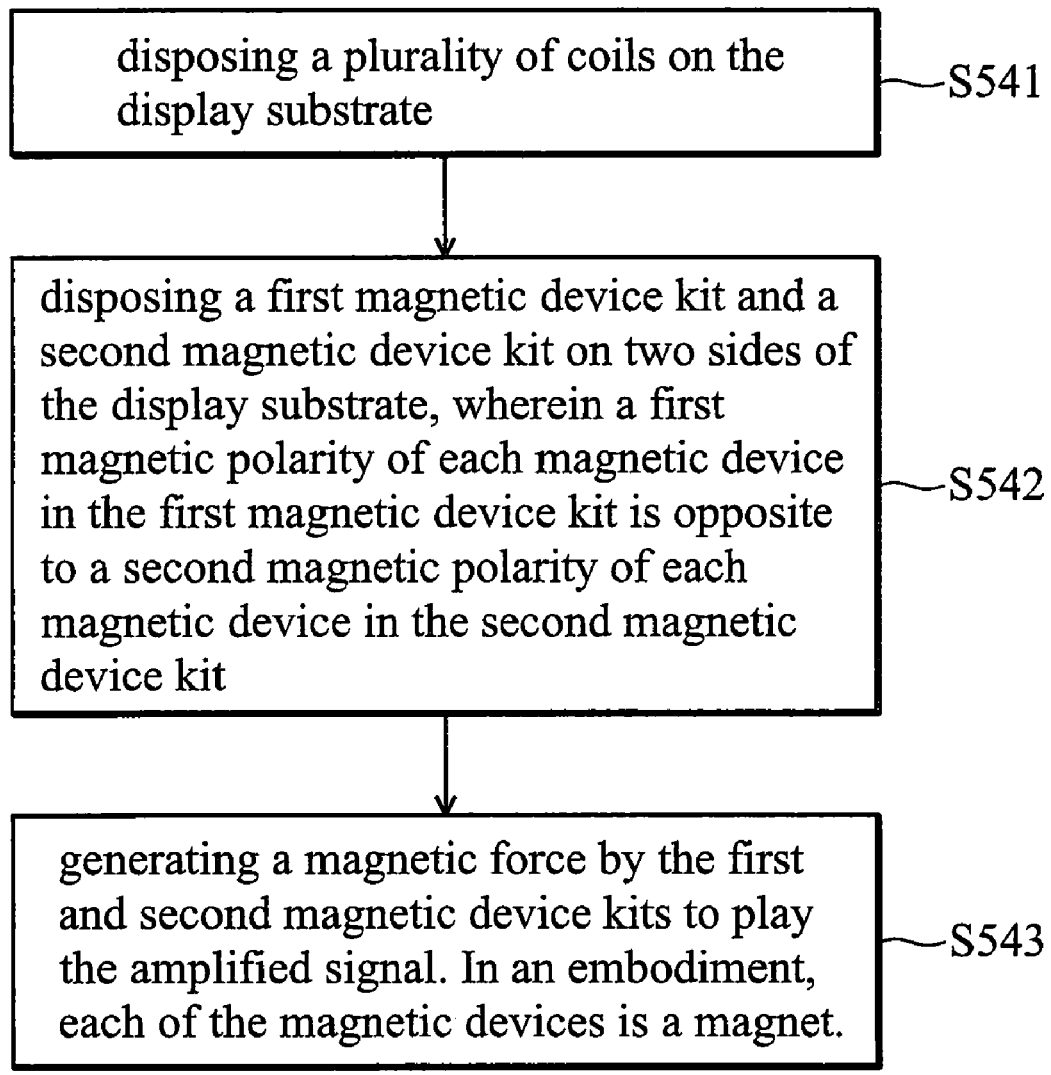
FIG. 6A is a flow chart of the step S54 of the audio output method according to the embodiment of the invention.

FIG. 6A is a flow chart of the step S54 of an audio output method according to an embodiment of the invention. In the embodiment, the predetermined way is a magnetic way. The step S54 uses a magnetic force to output the amplified signal. As shown in FIG. 6A, the step S54 comprises:

S541: disposing a plurality of coils on the display substrate;

S542: disposing a first magnetic device kit and a second magnetic device kit on both sides of the display substrate, wherein a first magnetic polarity of each magnetic device in the first magnetic device kit is opposite to a second magnetic polarity of each magnetic device in the second magnetic device kit; and S543: generating a magnetic force through the first and second magnetic device kits to output the amplified signal. In an embodiment, each of the magnetic devices is a magnet.

Figure 6B:
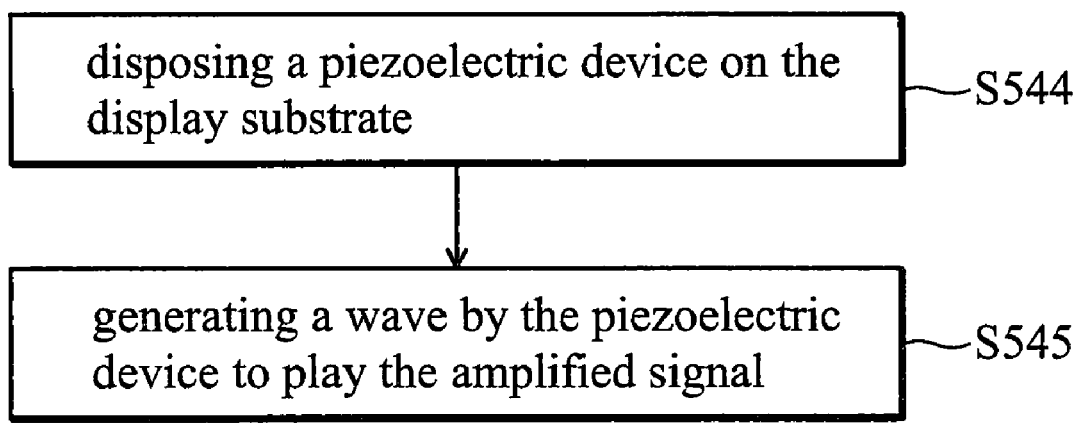
FIG. 6B is a flow chart of the step S54 of the audio output method according to another embodiment of the invention.

FIG. 6B is a flow chart of the step S54 of an audio output method according to another embodiment of the invention. In the embodiment, the predetermined way is a wave way. The step S54 uses a wave force to output the amplified signal. As shown in FIG. 6B, the step S54 comprises:

S544: disposing a piezoelectric device on the display substrate; and

S545: generating a wave by the piezoelectric device to output the amplified signal.

In preferred embodiment, the piezoelectric device is an acoustic speaker.

Figure 6C:
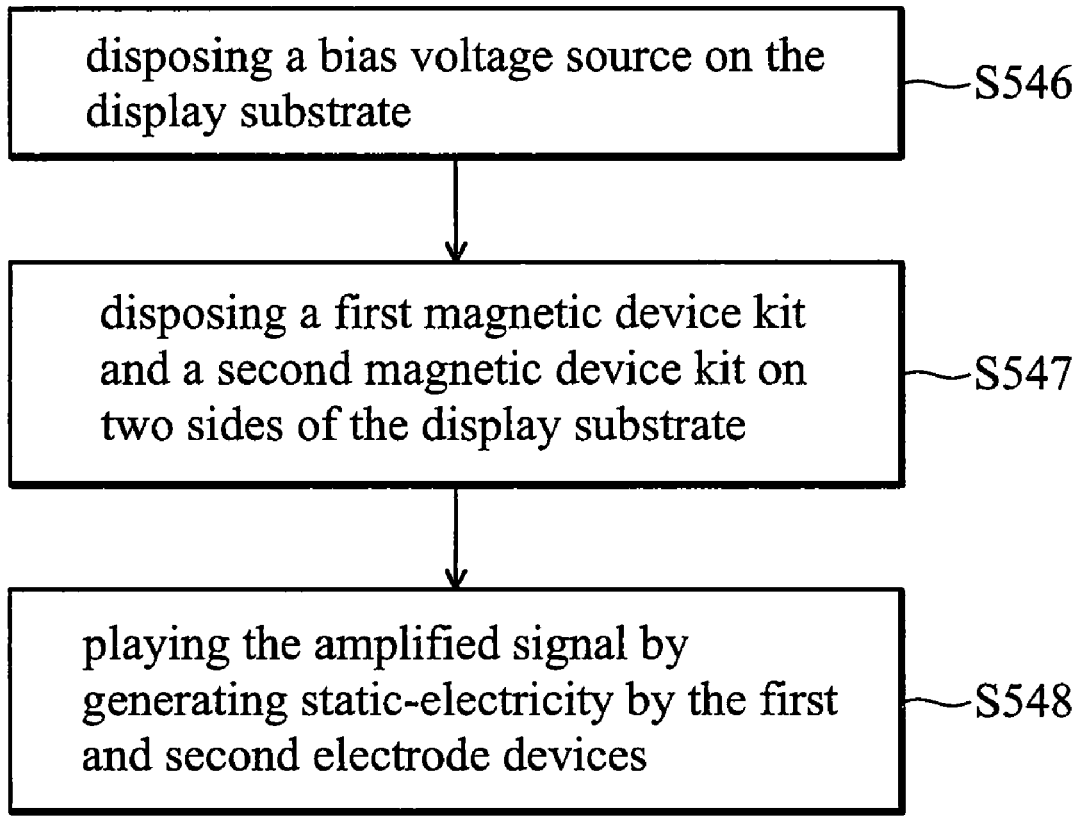
FIG. 6C is a flow chart of the step S54 of the audio output method according to yet another embodiment of the invention.

FIG. 6C is a flow chart of the step S54 of an audio output method according to yet another embodiment of the invention. In the embodiment, the predetermined way is a static-electric way. The step S54 uses a static-electric force to output the amplified signal. As shown in FIG. 6C, the step S54 comprises:

S546: disposing a bias voltage source on the display substrate;

S547: disposing a first magnetic device kit and a second magnetic device kit on both sides of the display substrate; and S548: outputting the amplified signal by generating static-electricity through the first and second electrode devices. In preferred embodiment, first magnetic device kit and the second magnetic device kit are electrode plates.

The disclosed embodiments of the invention respectively use a magnetic means, a piezoelectric means and a static-electric means to enable a thin film display to output audio signals in a limited space. As a result, the present invention provides a thin film displays with multiple functions, such as, audio function.

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. An audio module used for a display device with a display substrate, said audio module comprising:

a filter for receiving and filtering an audio signal to generate a filtered signal;

an amplifier coupled to said filter, which amplifies said filtered signal to generate an amplified signal; and at least one output unit coupled to the amplifier to output the amplified signal in a predetermined way, wherein said at least one output unit includes a plurality of device kits, and wherein said device kits comprise a first device kit and a second device kit, and said first and second device kits are respectively disposed on both sides of said display substrate, and said at least one output unit outputs said amplified signal in the magnetic way.

2. The audio module as claimed in claim 1, wherein said filter performs equalization filtering to said audio signal to generate said filtered signal.

3. The audio module as claimed in claim 1, wherein said audio module comprises a plurality of coils disposed on said display substrate, wherein said first and second device kits are a first and a second magnetic device kit, wherein a first magnetic polarity of each magnetic device in said first magnetic device kit is opposite to a second magnetic polarity of each magnetic device in said second magnetic device kit, and wherein each of said magnetic devices is a magnet.

4. The audio module as claimed in claim 1, wherein said predetermined way is a static-electric way, and said at least one output unit outputs said amplified signal in the static-electric way.

5. The audio module as claimed in claim 4, wherein the audio module comprises a bias voltage source disposed on said display substrate, wherein said first and second device kits are electrode plates.

6. The audio module as claimed in claim 1, wherein said display device is a thin film display or an electronic ink display.

7. An audio output method used for a display device with a display substrate, said audio output method comprising:
(a) receiving and filtering an audio signal to generate a filtered signal;
(b) amplifying said filtered signal to generate an amplified signal; and
(c) disposing a first device kit and a second device kit on both sides of said display substrate, and outputting said amplified signal through the first and the second device kits in a magnetic way.

8. The audio output method as claimed in claim 7, wherein the step (a) comprises performing equalization filtering to said audio signal to generate said filtered signal.

9. The audio output method as claimed in claim 7, wherein the first and the second device kits are a first magnetic device kit and a second magnetic device kit, and a first magnetic polarity of said first magnetic device kit is opposite to a second magnetic polarity of said second magnetic device kit; and
the step (c) comprises:
(c1) disposing a plurality of coils on said display substrate;
(c2) generating a magnetic force by said first and second magnetic device kits to play said amplified signal.

10. The audio output method as claimed in claim 9, wherein each of said magnetic device kits is a magnet.

11. The audio output method as claimed in claim 7, wherein said predetermined way is a static-electric way, and said amplified signal is outputted in the static-electric way.

12. The audio output method as claimed in claim 11, wherein said first and said second device kits are a first magnetic device kit and a second magnetic device kit; and wherein the step (c) comprises:
(c6) disposing a bias voltage source on said display substrate;
(c7) outputting said amplified signal for generating static-electricity through said first and second magnetic device kits.

13. The audio output method as claimed in claim 12, wherein each of said first magnetic device kit and said second magnetic device kit is an electrode plate.

* * * * *